US007642020B2

(12) United States Patent
Han et al.

(10) Patent No.: US 7,642,020 B2
(45) Date of Patent: Jan. 5, 2010

(54) METHOD FOR SEPARATING OPTICAL AND RESIST EFFECTS IN PROCESS MODELS

(75) Inventors: Geng Han, Beacon, NY (US); Scott M. Mansfield, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 193 days.

(21) Appl. No.: 11/465,227

(22) Filed: Aug. 17, 2006

(65) Prior Publication Data

US 2008/0044748 A1 Feb. 21, 2008

(51) Int. Cl.
*G03F 9/00* (2006.01)
(52) U.S. Cl. .......................................... 430/30; 430/22
(58) Field of Classification Search .................. 430/30; 356/123
See application file for complete search history.

(56) References Cited

U.S. PATENT DOCUMENTS

| 5,725,974 | A | 3/1998 | Kawahira |
| 6,376,139 | B1 | 4/2002 | Fujisawa et al. |
| 6,573,015 | B2 | 6/2003 | Fujimoto |
| 6,613,483 | B2 | 9/2003 | Fujimoto |
| 6,770,409 | B2 | 8/2004 | Yamada |
| 6,839,125 | B2 | 1/2005 | Hansen |
| 6,872,494 | B2 | 3/2005 | Hoshino |
| 6,902,852 | B2 | 6/2005 | Watanabe |
| 6,930,761 | B2 | 8/2005 | Ishikawa et al. |
| 2003/0059716 | A1* | 3/2003 | Simizu ........................ 430/30 |
| 2004/0158808 | A1* | 8/2004 | Hansen ........................ 716/21 |

* cited by examiner

*Primary Examiner*—Kathleen Duda
*Assistant Examiner*—Brittany Raymond
(74) *Attorney, Agent, or Firm*—DeLio & Peterson, LLC; Robert Curcio; Todd M. C. Li

(57) ABSTRACT

A methodology to improve the through-process model calibration accuracy of a semiconductor manufacturing process using lithographic methods by setting the correct defocus and image plane position in a patterning process model build. Separations of the optical model and the photoresist model are employed by separating out the adverse effects of the exposure tool from the effects of the photoresist. The exposure tool is adjusted to compensate for the errors. The methodology includes a determination of where the simulator best focus location is in comparison to the empirically derived best focus location.

10 Claims, 11 Drawing Sheets

METHOD FOR SEPARATING OPTICAL AND RESIST EFFECTS IN PROCESS MODELS

BACKGROUND OF THE INVENTION

1. Field of the Invention

The present invention relates to microlithography, a key technology used in the manufacture of micro-electronic devices. Specifically the invention relates to optical proximity correction models, and more specifically, to methods for improving the through-process model calibration accuracy.

2. Description of Related Art

Feature sizes for microelectronics continue to decrease as processes and fabrication techniques become more sophisticated and accurate for small-scale designs. During projection microlithography, a pattern defined on a reticle is projected by a beam onto the surface of a suitable substrate such as a semiconductor wafer, exposing a photosensitive photoresist. The photoresist is then developed. Optical proximity effects act adversely on resolution. These effects are caused by the distortion of the light intensity distribution, which creates a difference in the size of the photoresist between a dense pattern area and an isolated pattern area, and generates occurrences of roundness or over-cutting of the edge of the pattern.

Optical proximity effects are known to cause deviations in the intensity profiles of shapes placed in different proximity environments, and generally occur in the range near the resolution limit. When employing a lithographic method, the photoresist response to the light intensity profile is nonlinear and introduces its own errors as well. The combination of the nonlinear optical response and nonlinear photoresist response creates image distortion. Other processes, such as photomask manufacturing and the etching of the photoresist pattern into films on the semiconductor wafer, may also contribute to the distortion of the image that is transferred onto the wafer, so that it no longer looks identical to the designed pattern.

The correction of these distortions by pre-distorting the design to compensate for the processing nonlinearities is typically called Optical Proximity Correction, OPC, even though several non-optical effects may also be addressed in this correction. OPC is facilitated through the use of a model, referred to as the OPC model, which emulates the patterning process. The OPC model is typically composed of an optical model and a photoresist model, although it is recognized that other processes such as photomask manufacturing and etching may also be included in the OPC model. The optical and photoresist models are calibrated by collecting scanning electron microscope (SEM) measurements of test patterns, and then utilizing statistical curve fitting algorithms to minimize the error between the measured data and the simulations of the test patterns using the model. The typical optical model is physically based with parameters that have direct correlation with physical phenomenon. On the other hand, photoresist models are typically empirical models made by fitting semi-arbitrary polynomials to measurement data. The fitting coefficients do not correlate directly to any physically measurable parameters.

When calibrating an OPC model, it is difficult to separate nonlinearities that occur due to the optics from those that occur due to the photoresist. Currently, there are no feasible methods for measuring the image intensity inside the photoresist, so that the effect of the optics cannot be directly measured. Additionally, since the intensity used to expose the photoresist is not known exactly, one cannot determine the exact response of the photoresist to the input intensity. The only information that is currently available to a practitioner in the art is the input to the optical system, for example the photomask, and the output of the resist processing in the form of SEM measurements. Both the optics and the photoresist contribute to the distortion, but without further information, it is not possible to separate each component. However, it is very desirable to be able to do so, since the control and reduction of the nonlinearities can only occur if the sources of those nonlinearities are well understood.

Two of the primary sources of process variation in a manufacturing lithography process, focus and dose control, are due to variations in the optical system, where the film stack that exists on the semiconductor wafer is considered part of the optical system due to its complex reflectivity. Focus and dose control contribute significantly to the image intensity profiles inside the photoresist. These parameters may be adjusted on a typical lithography exposure system so that the same photomask pattern may be imaged into a photoresist with the same optics, but using varying focus and dose values. The focus value from the exposure tool, referred to as the experimental focus, is considered the position where the optics creates the image with the best image fidelity. The combination of the focusing of the exposure system with the placement of the semiconductor wafer inside the exposure system results in a pattern transfer process with varying pattern fidelity. When this combination results in the best possible image fidelity, the focus condition is considered the experimental best focus. Likewise, the dose value from the exposure tool is a measurement of the total amount of light intensity projected into the photoresist. Since the photoresist responds to light intensity levels, changing the dose will cause the size of the photoresist pattern to change. The dose value that creates patterns in photoresist that are closest to the desired size is considered the experimental best dose.

Unlike optical parameters that can be varied freely during the exposure process, the photoresist response to the image intensity profile is considered to be a more stable phenomenon that can only be varied by changes in chemical formulation or changes in the photoresist processing. Some photoresist process variations, such as changes in post-exposure bake temperatures, can be varied more easily than changes in chemical formulation, but since the photoresist models are generally not physically based, they may not be independently calibrated. Many photoresist models are based on a Constant Threshold Resist (CTR) model, where the photoresist is assumed to respond in a binary fashion, such that the photoresist is exposed for all intensity levels above a certain threshold value and not exposed for all intensities below that value. The threshold value at which the photoresist is first exposed is called the printing threshold. In a CTR model, the multiplicative inverse of the printing threshold is exactly analogous to the exposure dose. Since the CTR model is generally not accurate for OPC or lithographic process window simulations, refinements of this model have been made in the form of a Variable Threshold Resist (VTR) model. These models are based on modeling the variation of the threshold as a function of image parameters, and some use the CTR threshold as a stable reference threshold at which to compute certain image parameters.

Other distortion mechanisms exist due to the interaction of the exposure tool and the photoresist, in addition to those due to global focus shifts or photoresist blurring effects. One example of distortion is the illumination source spectral bandwidth coupled with chromatic lens aberration, which introduces a blurring of the image due to different wavelengths of light being focused to slightly different planes. Other mechanisms include vibration of the wafer relative to the optics in a direction either in the plane of focus or perpendicular to that plane, and a tilting of the wafer or the exposure slit relative to the focal plane. These types of blurring mechanisms may sometimes be approximated by an equivalent defocus value, and attempts have been made to compensate for the effect of one mechanism through the control of another mechanism. At the present, these effects have been ignored in OPC models.

When calibrating an OPC model, it is desirable to use the correct values for any parameters that correspond to true physical effects. Since the optical model is physically based, there is the potential to use true focus and dose values in the model. However, this is usually not implemented because the experimental focus value depends on the placement of the semiconductor wafer in the exposure system. Consequently, the experimental value and the modeled or simulated focus value are not identical. Since the photoresist model is an empirical model that approximates the true physical response, the plane or planes at which the image intensity profile is computed does not correlate directly with the experimental focus value. Instead, for the typical photoresist model, the optical image is computed at one or more image planes and the photoresist model is applied to the computed image(s). If the image is computed at more than one plane, the intensity profiles at the different image planes are typically averaged. The photoresist model is applied to this average intensity profile. Moreover, the simulated process conditions may include thin films in addition to photoresist on the wafer, and the image may be calculated within one of these thin film materials as well. The simulated image is a function of both the simulated image plane and the simulated focus, and neither of these values is exactly the same as the experimental focus value.

The experimental dose value represents the total amount of light intensity that enters the exposure system and, although there should be a direct correlation of this value with the light intensity values that occur inside the photoresist, the experimental dose cannot be utilized as a parameter in the OPC model. The transmission of the light through the entire optical system, photomask and wafer film stack is not characterized well enough to know the intensity values exactly. Similarly with focus, the approximate nature of the photoresist model and the use of a single image intensity profile, either computed at a single plane or averaged over several planes, further confound the specification of a single physical dose value.

In an OPC model calibration procedure, the methodology generally requires collecting SEM measurements that represent the empirical data of the test patterns used in the model calibration. The test patterns are normally exposed at the nominal process conditions at which the manufacturing process is run. An initial estimate of the free parameters in the OPC model is then established, and a simulation of the pattern transfer process of those same test patterns is done. Using the simulated pattern transfer process and the empirical data, an error metric is computed between the simulated and empirical dimensions. The free parameters are then varied, the test patterns simulated a second time, and the error metric recomputed. This process is repeated until the minimum error metric is found using a particular set of the free parameters in the OPC model. Using this methodology, the image plane, focus position, and dose are considered free parameters and are set by minimizing the error between simulated and empirical data at nominal process conditions. Often, this minimization process is first carried out using only an optical model and a CTR model to predict the resist printing, and then repeated keeping the optical parameters fixed and optimizing the photoresist model parameters. Alternatively, both optical and photoresist parameters may be simultaneously optimized. Unfortunately, this alternative approach converges to an incorrect (not true) focus position.

In addition to their use in correcting for patterning non-uniformities through OPC, photolithographic simulations are used to aid in the development, optimization, and use of lithographic apparatus. The simulations may be helpful as a development tool, by quickly evaluating options, optimizing processes, and saving time by reducing the number of required experiments. Traditionally, simulations are used to define the best illumination conditions in terms of depth of focus, exposure latitude, or dose-to-size for printing a pattern onto a substrate. Exposure latitude is commonly defined as the percentage dose range where the printed pattern's critical dimension, CD, is acceptable, and depth of focus describes the range of optical focus values where the CD is acceptable. Dose-to-size refers to the dose that is necessary to print the pattern to the desired size. The depth of focus and the exposure latitude are used to determine the process window, which ultimately keeps the final photoresist CD within prescribed specification limits. To facilitate the simulation of lithographic process windows, accurate models of the optical image formation and photoresist response are required. These models may be equivalent to OPC models, although it is understood that often speed versus accuracy tradeoffs are made during lithographic simulation and these tradeoffs may lead to some models being more preferential for OPC applications, and others for lithographic process window simulation.

To ensure that the model properly predicts lithographic behavior in the presence of process variations, it is critical that the focus and dose values of the optical model be calibrated properly. This is not necessary for an OPC model that is only used at nominal process conditions. Consequently, OPC models have been developed without this criterion. It is desirable to use OPC models in an application requiring process window information. To do so, improved calibration methodologies are necessitated.

SUMMARY OF THE INVENTION

Bearing in mind the problems and deficiencies of the prior art, it is therefore an object of the present invention to provide a methodology to improve the through-process model calibration accuracy of semiconductor design using lithographic methods.

It is another object of the present invention to provide a methodology for setting the correct defocus and image plane position in an optical proximity correction (OPC) model build.

A further object of the invention is to provide a methodology for achieving optical and photoresist model separation, and utilizing this knowledge in acquiring a more accurate and stable OPC model throughout a range of focus and dose variation.

Still other objects and advantages of the invention will in part be obvious and will in part be apparent from the specification.

The above and other objects, which will be apparent to those skilled in the art, are achieved in the present invention, which is directed to a method for a lithographic process model calibration for separating optical and photoresist effects, the method comprising: identifying a set of test patterns for model calibration, wherein the test patterns are printed onto a substrate using the lithographic process, and have design data for simulation; determining best alignment of simulated and empirical best focus positions through modeling of error between simulated and empirical critical dimension measurements of the test patterns for a plurality of focus and optical image plane positions; determining optimal location of the optical image plane position; determining the simulated and empirical best focus positions; and aligning the simulated and empirical best focus positions. Determining best alignment of the simulated best focus position includes determining a symmetry point of the error using the plurality of focus positions at the image plane position. Determining the optimal location of the optical image plane position includes determining a minimum point of the error using the plurality of image plane positions.

The optimal image plane position and the simulated best focus position may form a saddle point of the error using the plurality of focus and optical image plane positions. Conversely, the optimal image plane position and the simulated best focus position may form a minimum point of the error using the plurality of focus and optical image plane positions. An offset between the simulated best focus and the empirical best focus position may be determined.

The error may be minimized by varying a simulated exposure dose. Calibrating a photoresist model may be based on minimizing the error between empirical data for test patterns exposed at a nominal process condition and simulations of the test patterns, wherein a focus value used in the simulation corresponds to the offset added to the empirical data for test patterns exposed at the nominal process condition.

A focus-blur correction may be added to the offset to create a focus-blur-corrected offset. In this regard, a photoresist model may be calibrated based on minimizing the error between empirical data for test patterns exposed at a nominal process condition and simulations of the test patterns where the focus value used in the simulation corresponds to the focus-blur-corrected offset added to the empirical nominal focus value. The error may be computed as a mean error or root mean square error.

SEM measurements representing empirical data of the test patterns may be collected, and made on the test patterns exposed to nominal process conditions. Simulating the test patterns may be done using initial values of free optical parameters and a photoresist CTR model response. The CTR model response may be used with the optical model for predicting pattern transfer process and computing simulated critical dimensions or edge placement errors for the test patterns.

In a second aspect, the present invention is directed to a method for a lithographic process model calibration for separating optical and photoresist effects, the method comprising: identifying a set of test patterns for model calibration, wherein the test patterns are printed onto a substrate using the lithographic process, and have design data for simulation; and determining best alignment of simulated and empirical best focus positions through modeling of error between simulated and empirical critical dimension measurements of the test patterns for a plurality of focus and optical image plane positions. The optimal image plane includes selecting a first minimum point on a plot of the error. The best alignment of simulated and empirical best focus includes selecting a symmetry point on a plot of the error versus defocus values for selected image planes. The error includes an RMS error, mean error, WACD error, or WAEPE error. The step of determining best alignment includes using errors computed with off-focus data, and comparing off-focus simulated data to off-focus empirical data, where the off-focus simulations are performed at off-focus simulated defocus-values. The off-focus simulated defocus-values are equal to a sum of a nominal simulated defocus value plus a difference between corresponding off-focus empirical defocus values and nominal empirical defocus value. The off-focus simulated defocus-values include an adjustment to account for focus-blurring mechanisms. The focus-blurring mechanisms can be approximately modeled using a single focus-blur value.

The off-focus simulated defocus-values are equal to a sum of the nominal simulated defocus value plus a factor times a root-squared-sum of the focus-blur value and a defocus value, where the defocus value equals a difference between corresponding off-focus empirical defocus values and nominal empirical defocus value; the factor is set to 1 for the off-focus empirical defocus values greater than or equal to the empirical best focus position, and the factor is set to −1 for the off-focus empirical defocus values less than the empirical best focus position.

Alternatively, the off-focus simulated defocus-values is set to a sum of the nominal simulated defocus value plus a factor times a sum of an absolute value of the focus-blur value and a defocus value, where the defocus value equals a difference between corresponding off-focus empirical defocus values and nominal empirical defocus value; the factor is set to 1 for the off-focus empirical defocus values greater than or equal to the empirical best focus position, and the factor is set to −1 for the off-focus empirical defocus values less than the empirical best focus position.

In a third aspect, the present invention is directed to a program storage device readable by a machine, tangibly embodying a program of instructions executable by the machine to perform method steps for a lithographic process model calibration for separating optical and photoresist effects, the method steps comprising: identifying a set of test patterns for model calibration, wherein the test patterns are printed onto a substrate using the lithographic process, and have design data for simulation; determining best alignment of simulated and empirical best focus positions through modeling of error between simulated and empirical critical dimension measurements of the test patterns for a plurality of focus and optical image plane positions; determining optimal location of the optical image plane position; determining the simulated and empirical best focus positions; and aligning the simulated and empirical best focus positions. The program storage device may further include: determining a minimum point of the error using the plurality of image plane positions, such that the optimal image plane position and the simulated best focus position form a saddle point of the error using the plurality of focus and optical image plane positions; and determining an offset between the simulated best focus and the empirical best focus position.

BRIEF DESCRIPTION OF THE DRAWINGS

The features of the invention believed to be novel, and the elements characteristic of the invention, are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
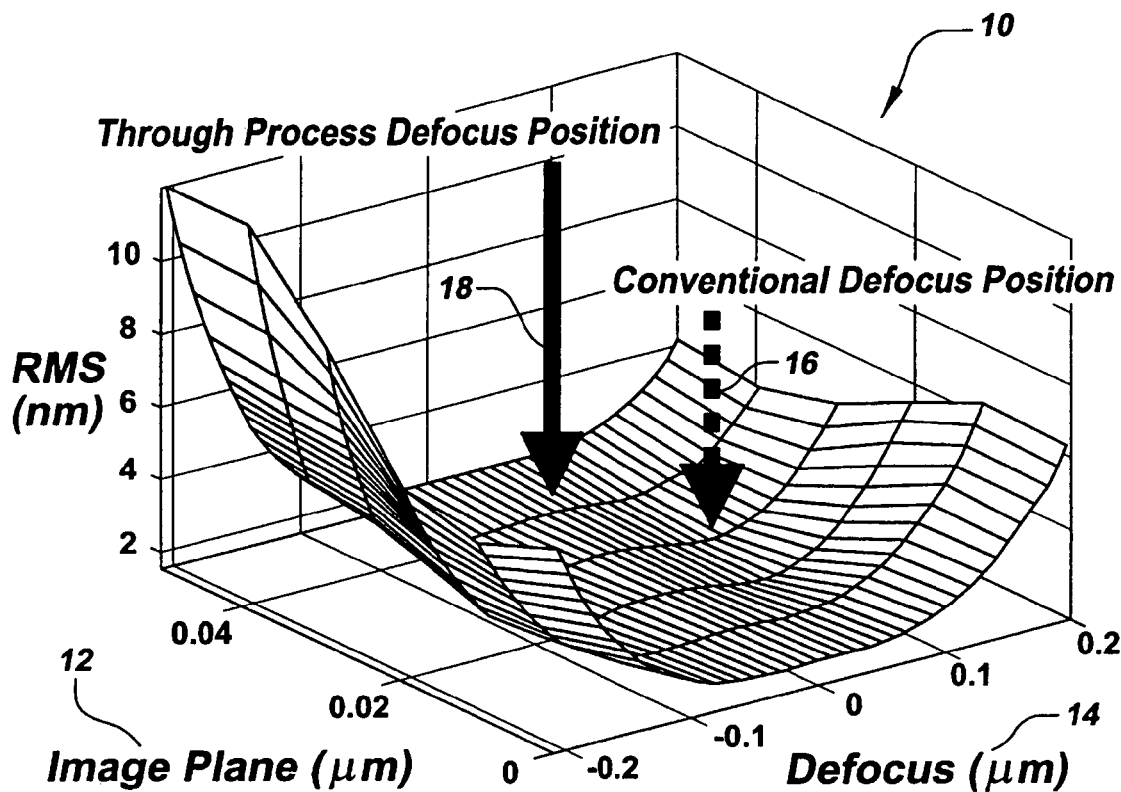
FIG. 1 is a three-dimensional surface plot of the RMS error versus defocus and image plane position.

In describing the preferred embodiment of the present invention, reference will be made herein to FIGS. 1-13 of the drawings in which like numerals refer to like features of the invention.

The present invention introduces a methodology to improve the through-process model calibration accuracy of semiconductor manufacturing using lithographic methods by setting the correct image plane position, focus position and dose in an optical proximity correction (OPC) model build. It is important that the OPC model be formulated with sufficient accuracy throughout a typical range of process related conditions, such as focus and dose. In order to achieve this, separation of the optical model and the photoresist model is employed. By studying and modeling the behaviors of focus and image plane position through-process, it is possible to achieve optical and photoresist model separation, and utilize this knowledge in acquiring a more accurate and stable OPC model throughout a range of focus and dose conditions that exist in a typical semiconductor manufacturing process.

Simulations of the optical image indicate a focus plane position where the image has a best focus, or where the blurring of the image is minimized. The behavior of the optical image size is approximately symmetric through a range of focus values around best focus, where the range is typically on the order of the wavelength of the light used to form the image. Empirical data collected at various focus points will not necessarily align with the simulation focus, but will also exhibit approximately symmetric behavior in the vicinity of the empirical, or experimental, best focus. Importantly, the change in image size at varying focus will be approximately equal for the simulated and empirical data. If, for instance, the empirical data changes by 10 nm for a focus of 50 nm from the empirical best focus, then the simulation data can be expected to change by approximately 10 nm for a focus value 50 nm from the simulated best focus. To the extent that the simulated change does not match the empirical change, the simulated model will exhibit an error. The methodology of the present invention minimizes this through-focus error.

The methodology of the present invention requires the assimilation of empirical and simulated data to determine the best alignment of simulated and empirical focus. Unlike the traditional approach of simultaneously optimizing the image plane, focus position, and dose by minimizing the error between simulation and empirical data, an optimum image plane is first determined. Data is collected for model calibration patterns that are exposed under varying focus, and an optimum image plane is selected from a comparison of the simulated data to empirical data. Data collected for calibration patterns exposed under varying dose conditions may also be utilized, but is not required. Given the determination of an optimum image plane, the method then determines best focus and dose.

The determination of the simulated and empirical best focus is complicated by the fact that different patterns exhibit different behavior as focus is varied, and will generally have different best focus locations. To account for this, an average response is calculated based on the weighted average critical dimension for all of the calibration patterns. This weighted average critical dimension, WACD, is computed for both the empirical calibration data and the simulations of the corresponding calibration patterns. The response of these values at varying focus conditions is then used to align the empirical and simulated best focus positions. The preferred procedure for doing so is described in more detail in reference to FIGS. 1-13.

The methodology protocol generally requires collecting SEM measurements that represent the empirical data of the test patterns used in the model calibration, where these measurements are made on test patterns that have been exposed at nominal process conditions. These same test patterns may then be simulated using initial values of the free optical parameters in the optical model and a CTR model for the photoresist response. The threshold used by the CTR model can be set using industry standard methods. The optical model simulation with CTR is then used to predict the pattern transfer process and to compute the simulated critical dimensions, CDs, or edge placement errors, EPEs, for all of the test patterns. The error between the simulated and the empirical values is computed. A mean error and root mean squared, RMS, error are assigned to the fitted data, which describe the match between the simulated and empirical dimensions. These values are typically computed using weighted statistics on the CD errors or EPE. Alternatively, the simulated WACD error, or the weighted average edge placement error (WAEPE), which is generally one-half of the WACD error, may also be used. The benefit of the WACD error and WAEPE values are that they are independent of the measurement data and only describe the simulated response. This method further requires that the correct exposure dose must be specified to properly anchor the simulations to the experimental process conditions. Any of the four values specified (mean error, RMS error, WACD error and WAEPE) can be used to find the best match of the simulated focus position to the empirical focus position, and at times more than one value is used to find this match. One example of the error computation for a simulated focus value, f, and an image plane, p, is given by:

$$\text{Error}(f, p) = \frac{\sqrt{\sum_{i}^{N}(S_i(f, p) - E_{0i})^2}}{N} \quad \text{(Equation 1)}$$

where $S_i(f,p)$ is the simulated CD of the $i^{th}$ test pattern, $E_{0i}$ the empirically measured CD of the $i^{th}$ test pattern at nominal process conditions, and N is the total number of test patterns. This equation computes an RMS error.

In the preferred embodiment of this invention, the alignment of the simulated and empirical best focus positions is enabled by first determining the simulated best focus location. The image plane location and the image focus value are separate values, but the optical image intensity depends on both. The nature of this dependency is depicted in FIG. 1. This represents a three-dimensional chart 10 of the RMS error of the simulated test patterns to the measured test patterns for varying image plane 12 positions and focus plane positions relative to the top of the photoresist defocus 14. In the preferred embodiment, this type of plot is used to calibrate the image plane and focus positions of the optical model. Employing the prior art method would have selected the value corresponding to position 16, whereas the method of the present invention adjusts this value to that corresponding to position 18. The origin of both the image plane and defocus axes in the FIG. 1 chart represents the top of the photoresist, but other origin locations could be chosen.

As can be seen in FIG. 1, in the conventional model build method the image plane and focus positions are generally selected using the processes of optimization and minimization, so that the error at the selected position 16 represents a minimum. Since the prior art position 16 is different than that of the position 18 of this embodiment, models built using these two methodologies will behave differently. The differences are expected to be most pronounced if the models are used to predict behavior under varying focus conditions, but it is also expected that differences may also be apparent at nominal process conditions. If optical models are built at different focus positions, these models will create intensity profiles with differing amounts of blur due to defocus of the image. If it were possible to measure the true intensity profile inside the photoresist during the exposure process, it might be possible to tell which image intensity profile is closer to matching the true physical profile. However, this measurement is not possible. Instead, a photoresist model must be created and the response of that model compared to the measured photoresist critical dimension measurements. The risk in creating a photoresist model in this way is that the photoresist model may then compensate for the errors generated with the optical model. This results in an unstable and inaccurate OPC model under varying process conditions. The present invention facilitates selection of the most suitable defocus and image plane position, so that the optical and photoresist models are well separated, and the overall behavior through-process is stable and accurate.

Figure 4:
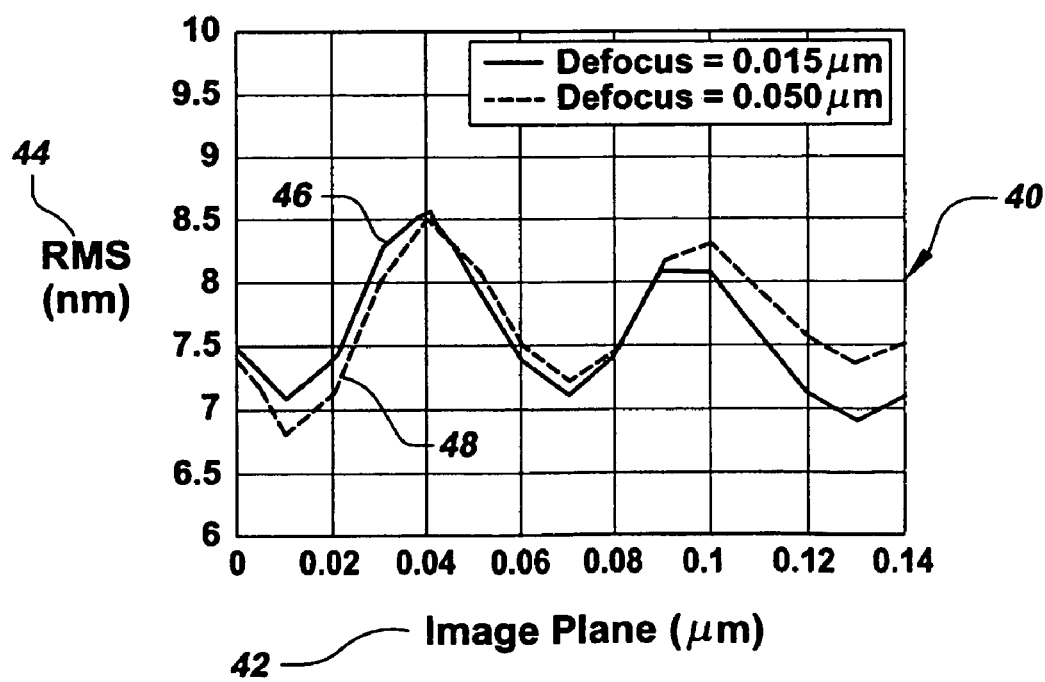
FIG. 4 depicts a graph of the RMS error against the image plane for given defocus positions.
Figure 5:
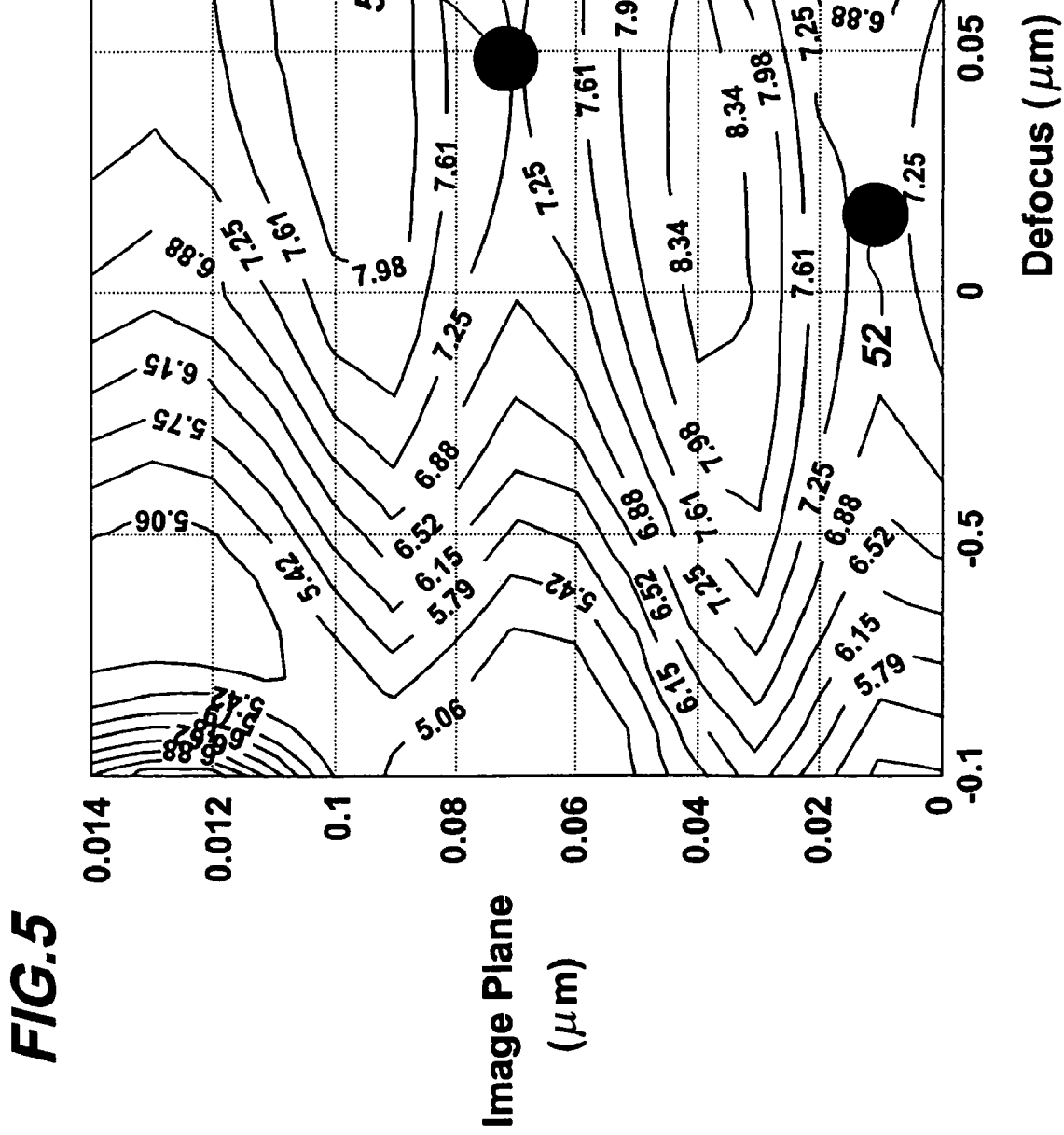
FIG. 5 depicts the position of the saddle points for the image plane and the defocus.

One aspect of the preferred embodiment, then, is the determination of the location of the image plane. For any particular defocus, due to interference effects inside the thin films causing standing waves, the RMS error has a sinusoidal-like shape versus the image plane position. FIG. 4 depicts a graph 40 of the RMS error 44 against the image plane 42 for given defocus. Two defocus values 46, 48 are depicted for 0.015 μm and 0.050 μm, respectively. The sinusoidal variations are a function of the optical parameters of the photoresist. Following the methodology of the present invention, the first minimum point of the sinusoidal curve is selected to decide the image plane position to build the simulation model. This is generally the image plane just below the top of the photoresist. FIG. 5 depicts the position of these local minima along the image plane axis and local maxima along the defocus axis, forming the saddle points 50, 52 as a function of the image plane and the defocus.

It is recognized that the image plane may be set in various ways and that using the local minimum is just one possibility. However, after the image plane has been selected, the simulated best focus position is set based on the symmetry point in a plot of error versus defocus for the selected image plane. The RMS error versus defocus is the preferred data to use for this step, but it is recognized that mean error, WACD error, or WAEPE could also be used.

Figure 2:
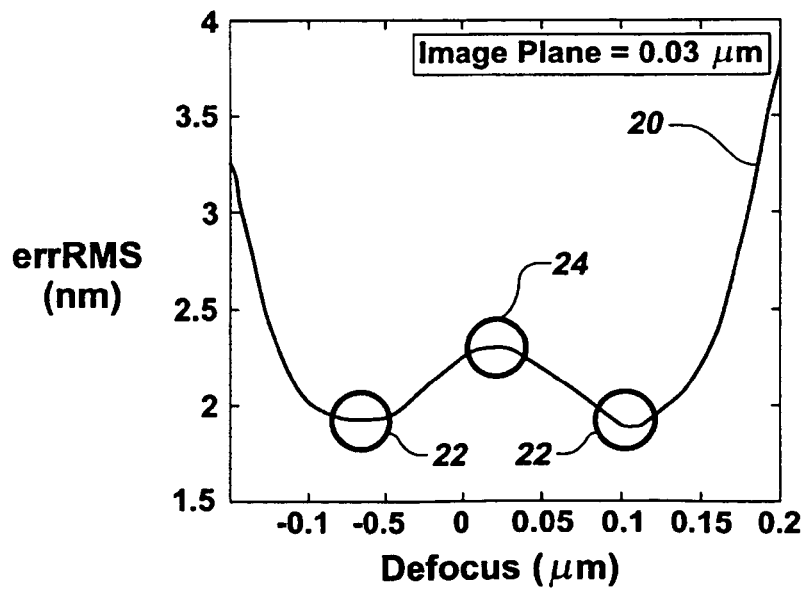
FIG. 2 depicts a cross-section of the plot of FIG. 1 at the image plane of approximately 30 nm.

FIG. 2 depicts a cross-section of the plot of FIG. 1 at the image plane of approximately 30 nm. As shown, a curve 20 relating RMS error to the defocus position is shown. There are two minimum locations 22 in the curve 20, and one maximum location 24. Following the traditional model build method, one of the two minimum locations would have been selected as the position of best focus or equivalently the center focus position. However, the present invention requires the selection of the local maximum error location 24, which corresponds to a defocus value of approximately 25 nm, because it is well centered and the most stable point through the arranged focus settings. In this manner, the optical model will have an error curve that is symmetric about the optical point of best focus. As the defocus location is shifted away from the selected focus point 24, the error between the optical image and the empirical data decreases. The optical image becomes blurred away from the focal point 24, better resembling the blur in the empirical data; however, this modeling is indicative of a mathematical artifact that cannot accurately reflect the physical process. In reality, the blurring is caused by a property of the photoresist and should be accounted for in the photoresist model, not within the optical image. Since the optical image is known to be approximately symmetric through best focus, the local maximum, symmetrical point 24 is considered the best focus point for the optical model.

Figure 3:
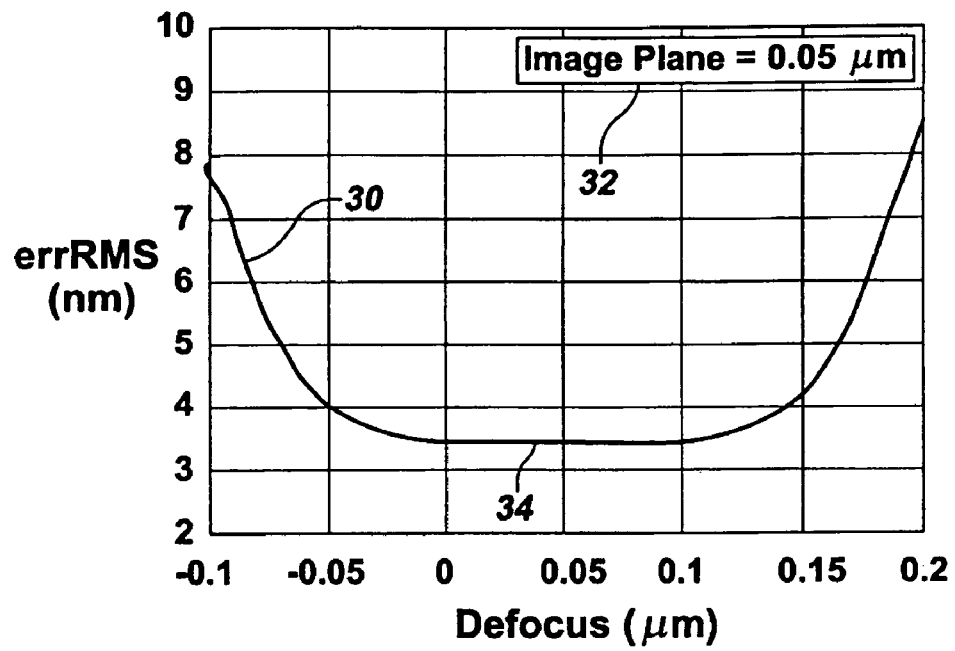
FIG. 3 depicts the cross-sectional defocus curve at the image plane of approximately 50 nm.

In other instances, the saddle shape of FIG. 2 is not obtainable. The cross-section of the RMS error versus defocus will depict a curve having a local minimum defocus position. FIG. 3 depicts the cross-sectional defocus curve 30 at a given image plane position 32 exhibiting a centered, local minimum defocus position 34. Since there are no local maximums in the defocus position, the local minimum should be selected for the defocus since it is well centered, and represents the best symmetrical position.

Figure 6:
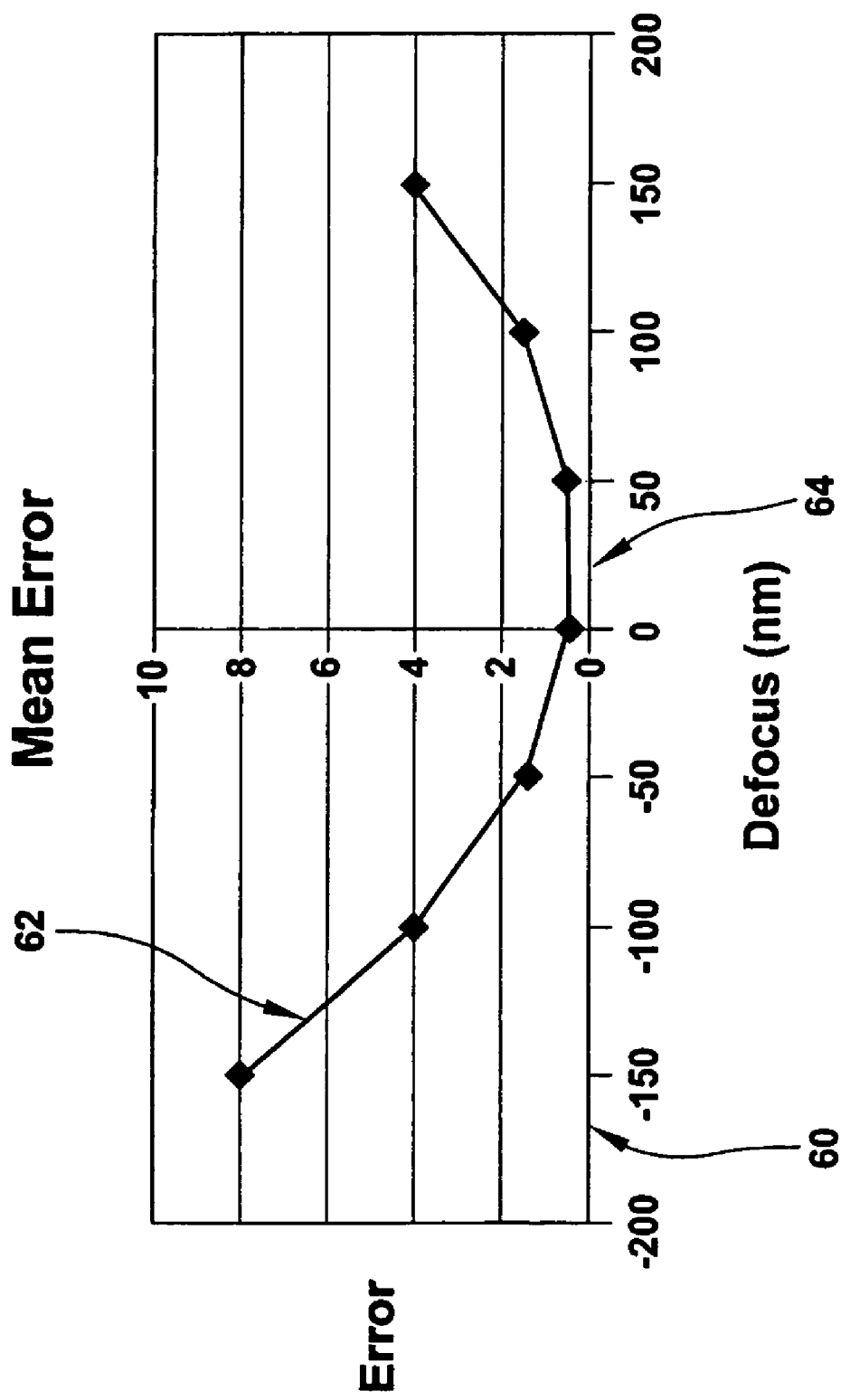
FIG. 6 is a graph depicting an example of the error curve through focus.

After determining the simulated best focus location, the next step in minimizing the error between simulated and empirical data is to align the simulated best focus with the empirical best focus. This alignment is achieved using errors computed with off-focus data. A direct comparison of off-focus simulated data is made to off-focus empirical data, where the off-focus simulations are done by first choosing a nominal simulated defocus value which will be used to compare to the nominal empirical data. Then, the off-focus simulations are done at an off-focus simulated defocus value that is equal to the nominal simulated defocus plus the delta between the corresponding off-focus empirical defocus value and the nominal empirical defocus value. The error function considered is the mean of the error between the measured or empirically derived data and simulated data. When the model is built at the correct defocus position, the error curve is symmetric and relatively flat across, as depicted in FIG. 6. This graph 60 shows the error curve 62 between the measurements and simulation plotted versus the simulated defocus value. In this case, the empirical data is not centered at the experimental best focus and the error curve 62 has a minimum 64 at a defocus of about 25 nm.

Figure 7:
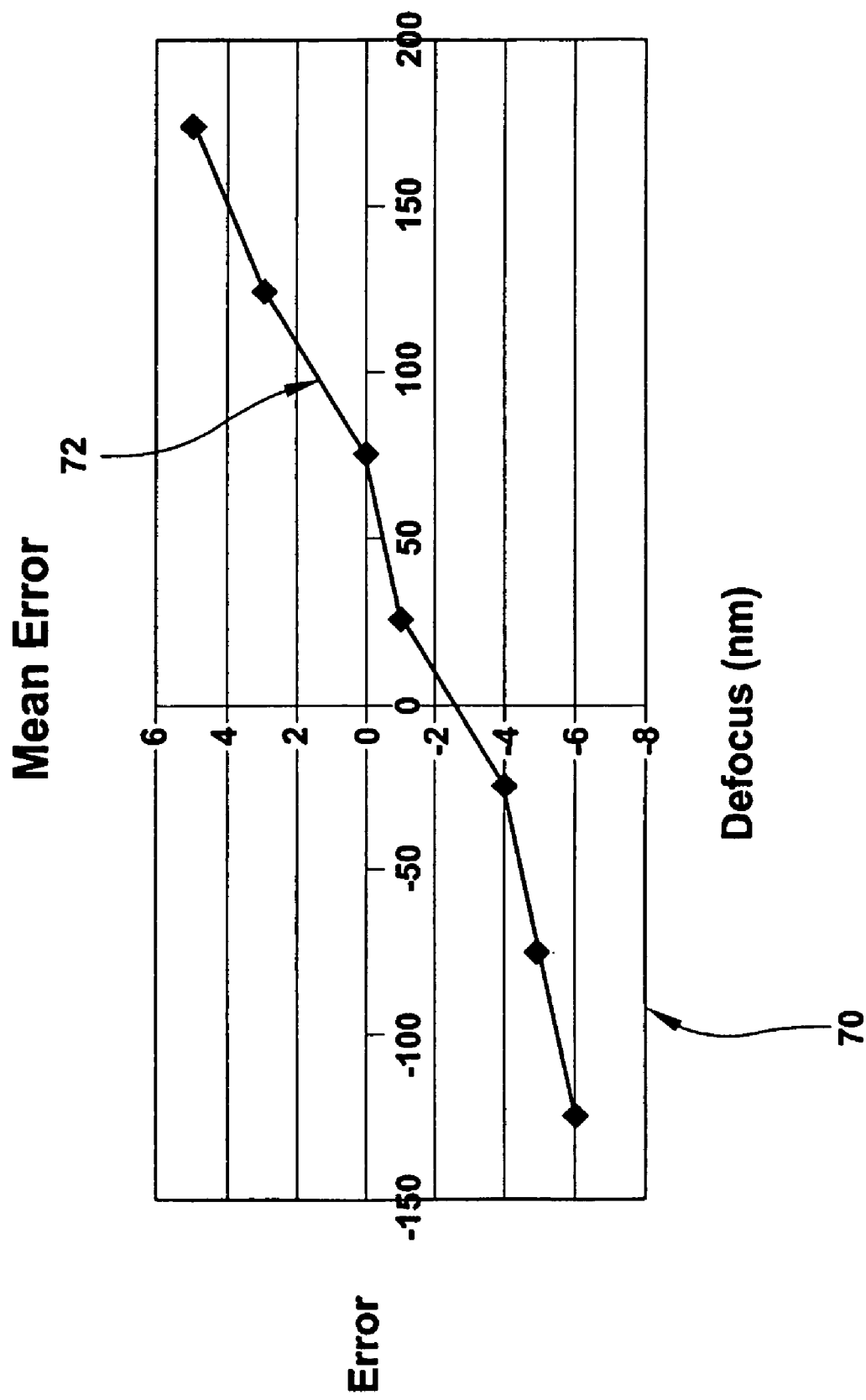
FIG. 7 depicts a graph of the error curve where the error curve proceeds from negative to positive across the focus.
Figure 8:
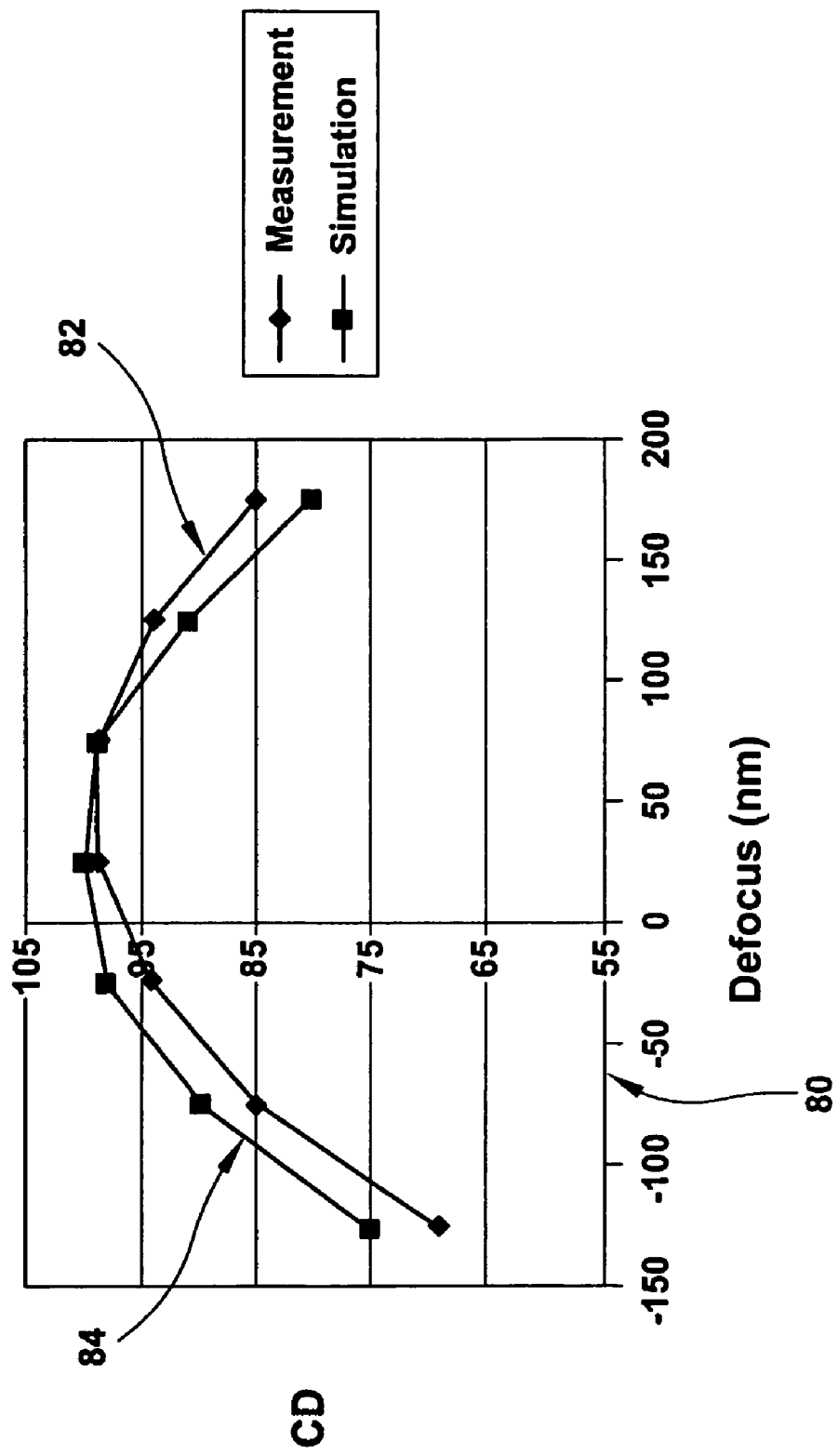
FIG. 8 depicts a graph of the weighted-average CD for the error curve of FIG. 7.

To achieve the alignment of simulated and empirical best focus locations, a few steps must be taken. First, the nominal simulation defocus must be adjusted to make the error curve either all positive or all negative. FIG. 7 depicts a graph 70 where the error curve 72 proceeds from negative to positive across the focus. This arrangement implies a shift in the nominal simulation defocus to move more to the negative side. FIG. 8 depicts the weighted-average CD through-focus plot 80. The measurement curve 82 represents the weighted-average SEM measurements at each measured focus condition. The empirical data is at very discrete focus steps and in the simulation the focus data is varied by the same discrete steps. Consequently, simulation curve 84 represents the weighted-average simulated CD at various focus conditions, where the focus steps are equivalent to the experimental data. In this plot, the x-axis corresponds to the simulated defocus value, so that the empirical data points are plotted versus the defocus values for their corresponding simulation points, and not against the empirical defocus values. One may obtain curve 72 in FIG. 7 by subtracting the simulated data points on curve 84 from the measured points on curve 82.

Figure 9:
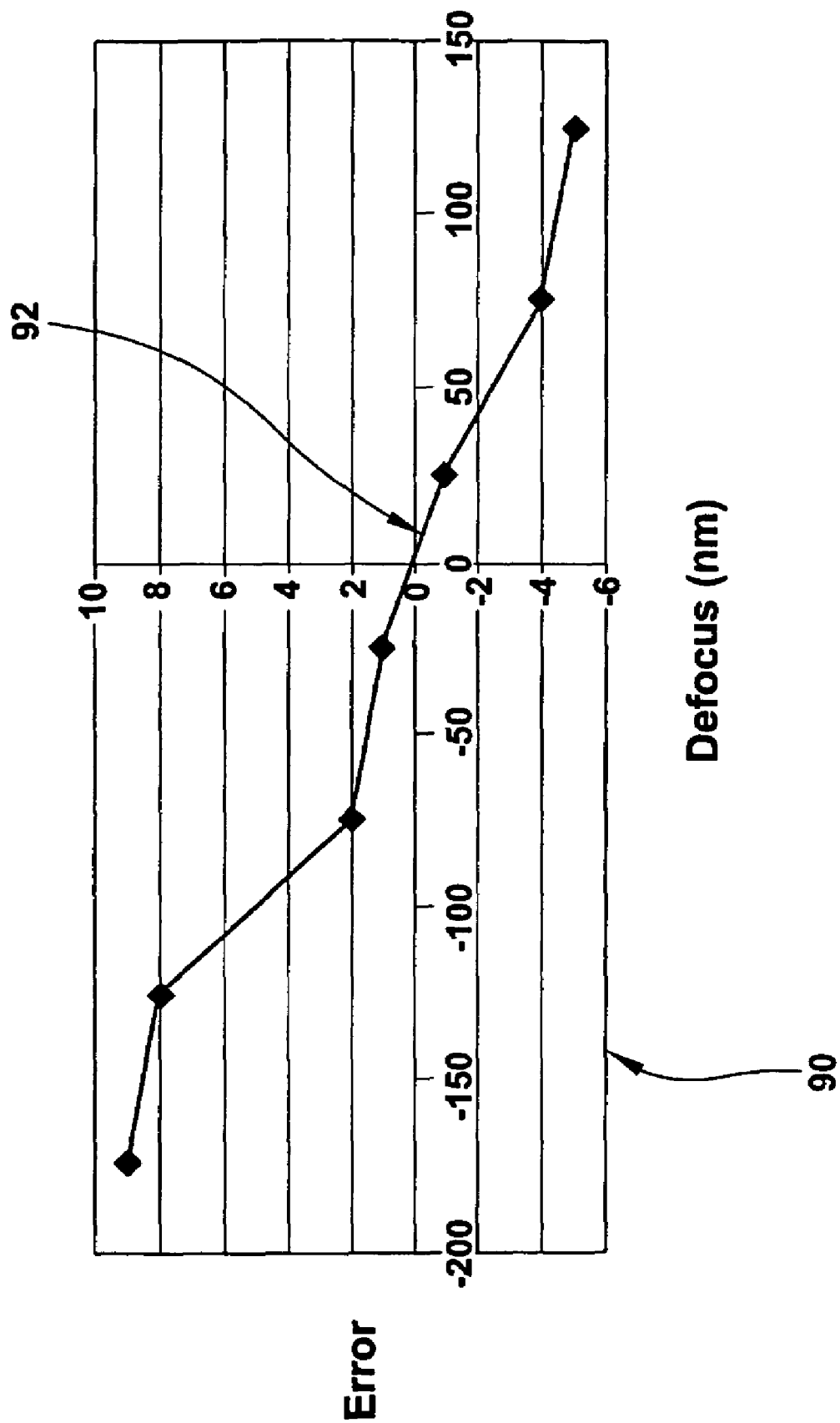
FIG. 9 depicts a graph of the error curve where the error curve proceeds from positive to negative across the focus.
Figure 10:
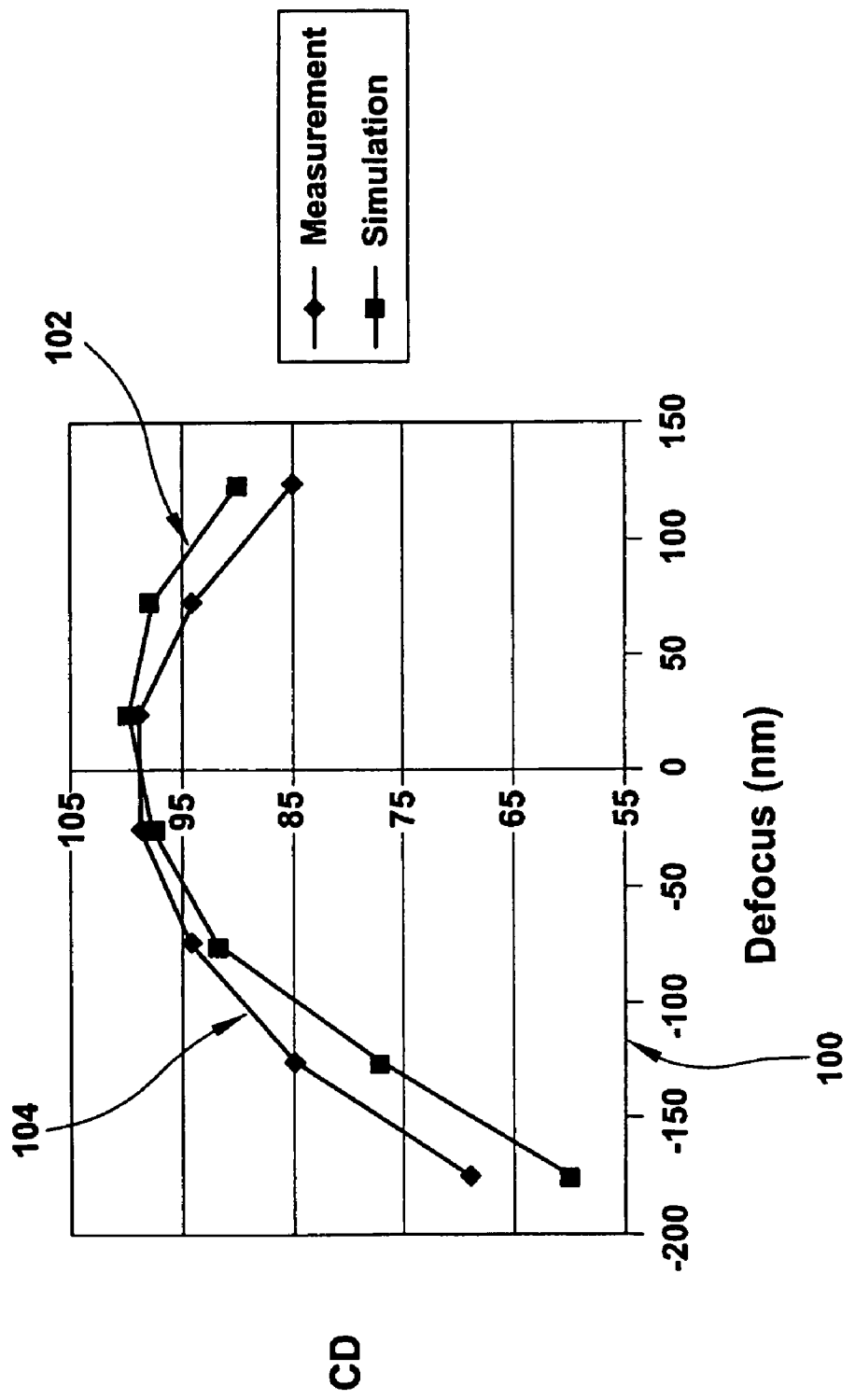
FIG. 10 depicts a graph of the weighted-average CD for the error curve of FIG. 9.
Figure 11:
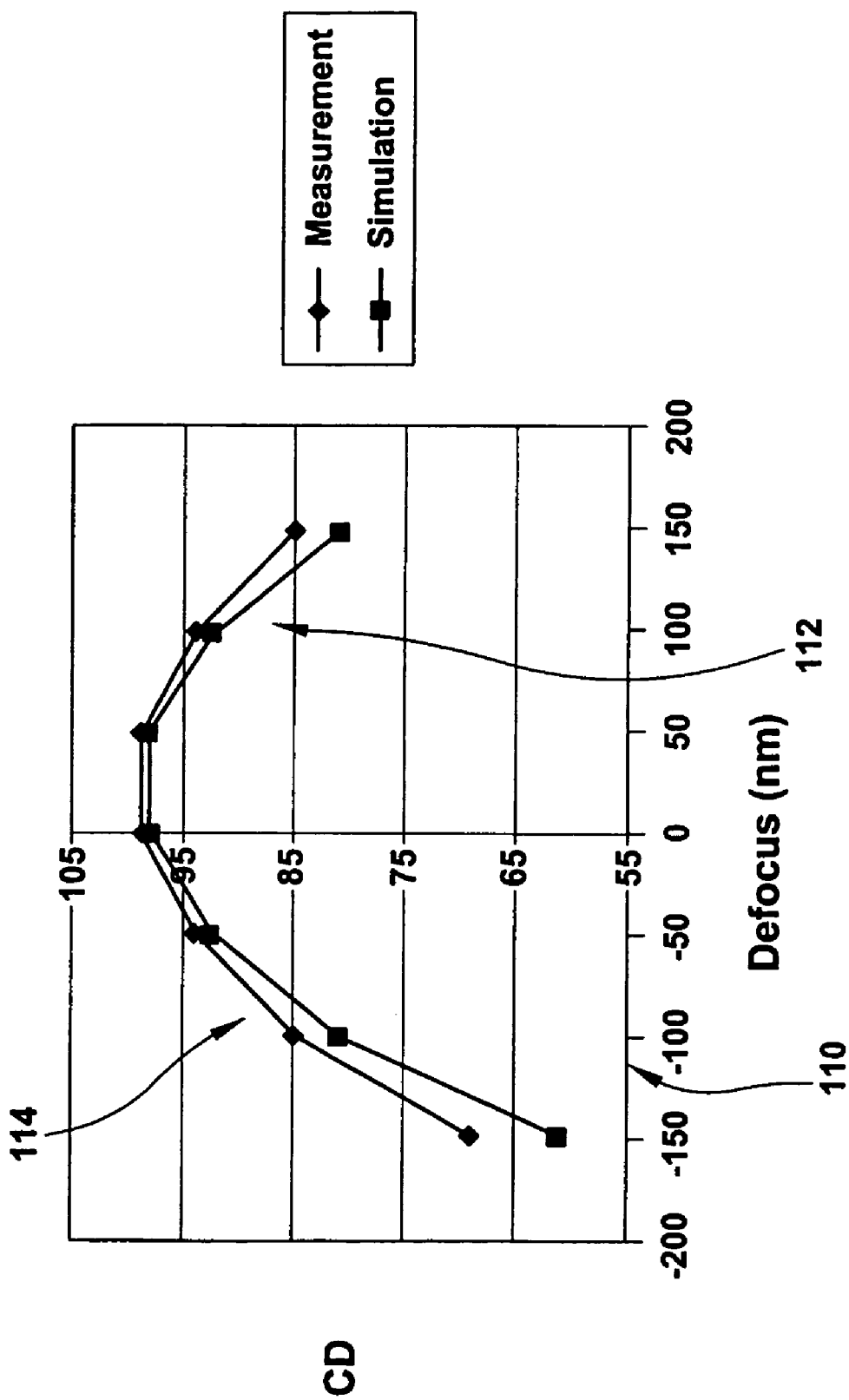
FIG. 11 depicts a graph of the weighted-average CD for the error curve of FIG. 6.

FIG. 9 depicts a graph 90 of the case where the error curve 92 proceeds from positive to negative across the focus. This means the nominal simulation defocus must move to the positive side, as indicated by FIG. 10. FIG. 10 depicts a graph 100 of the weighted-average CD. As shown, the simulation curve 102 is shifted to the right or positive side, in relation to the measurement curve 104.

The defocus adjustments are repeated until the errors are either all positive or all negative. In FIG. 6 the error curve 62 would comprise all positive values. A further fine-tuning of the focus alignment is achieved by adjusting the simulated focus values until the turning point of the mean error curve falls exactly at the value of the simulated best focus location. Since the minimum of the error curve 64 corresponds to the same defocus as the simulated best focus 24 from FIG. 2, this indicates that the simulated and empirical best focus locations are well aligned and offset from the nominal empirical data by 25 nm. In other words, the nominal empirical data is 25 nm from the empirical best focus. The alignment of the simulated and measured through-focus curves is also depicted in plot 110 of FIG. 11 where simulation curve 112 is well aligned with measurement curve 114. The defocus adjustment used to create FIGS. 6 and 11 results in the best alignment of the simulated and empirical focus values.

Alternatively, the alignment of the simulated and empirical focus values is accomplished without explicitly computing the simulated best focus. The methodology protocol of FIG. 1 is combined with the method steps depicted by FIGS. 6-11 in an effort to find the symmetry of the error curve in one step. In FIG. 1, the error between the nominal experimental data and the simulated value for the nominal condition is calculated. The simulation data is compared to the nominal data, and the error between the simulated and the nominal data is plotted as a function of image plane and defocus. In this alternate embodiment, in addition to comparing simulation data to nominal experimental, the defocus conditions are investigated as well. Out-of-focus conditions are also simulated and compared to out-of-focus experimental data. Statistics are then performed on the resultant values and the resultant errors. These statistics are used as metrics to determine the image plane and defocus values that result in the optimum alignment of the simulation and empirical data.

In this alternative embodiment, an error versus image plane and defocus surface plot is computed in a manner similar to that described in reference to FIG. 1. However, the error value itself is computed in a different manner. Instead of only computing the error between the nominal empirical data and the simulated data, all of the through-focus empirical data and simulated data are considered. Statistics are performed on errors at all different focus positions for which empirical data exists. For every combination of image plane and defocus, a single error value is found. This value is computed based on analyzing the symmetrical and empirical data at multiple focus positions. The nominal empirical data is compared to the simulated data at the particular image plane and defocus value of interest. In addition, the off-focus empirical data is also compared to simulated data, where the simulation is done at a defocus value that is offset from the defocus value of interest by an amount equal to the offset between the focus value of the off-focus empirical data and the nominal empirical data. In this manner, the errors of all of the off-focus positions may be combined with the nominal position and statistics computed for the full data set, resulting in a single error value for the image plane and defocus value of interest. As described in regard to FIG. 1, this error value could be chosen from several values including the mean error, RMS error, WACD error or WAEPE.

For the case of the RMS error, Equation 1 is further generalized to:

$$\text{Error}(f, p) = \frac{\sum_{j}^{M} \sqrt{\sum_{i}^{N} (S_i(f_j, p) - E_{ji})^2}}{N} \quad \text{(Equation 2)}$$

where $f_j$ is the $j^{th}$ simulation focus value, $E_{ji}$ is the empirical measurement of the $i^{th}$ test pattern at the $j^{th}$ focus value, and M is the total number of measured focus values. The $j^{th}$ simulated focus value can be found using:

$$f_j = f + (d_j - d_0) \quad \text{(Equation 3)}$$

where f is the focus value of interest, $d_j$ is the $j^{th}$ empirical focus value and $d_0$ is the nominal empirical focus value.

Once the error versus image plane and defocus surface plot has been computed, the optimum image plane location and defocus value can be chosen in a manner analogous to that described in regard to FIGS. 1-5, where a local minimum can be found in the direction of the image plane axis and the correct defocus value found by choosing the point of symmetry. The point of symmetry represents the image plane and defocus value where the simulated and empirical data are best aligned. It is not necessary in this alternative embodiment to overlay the simulated best focus with the measured best focus, as was previously required in the first embodiment.

An additional aspect of both the first and second embodiments of this invention is the ability to account for other blurring mechanisms that are not caused directly by a global focus shift or by a photoresist effect. When the impact of these effects can be converted into a single value that approximates a focus shift, referred to as the focus blur, this value can be directly added to the simulation best focus value to create a new focus-blur corrected, FBC, best focus. The out-of-focus simulated defocus values can also be corrected to new values that account for focus blurring effects, using various methods. The preferred method is to take the root-squared-sum, RSS, value of the focus blur and the delta between the simulated defocus value and the simulated best focus value, and then add or subtract that to the simulated best focus value to create a new FBC simulated defocus value. The RSS value is either added or subtracted based on the sign of the delta between the simulated defocus and best focus values, so that if the simulated defocus is more negative than the best focus value, the RSS value is subtracted and the FBC simulated defocus value is also more negative than the best focus value. Another method is to add the absolute values of the focus blur and the delta between the simulated defocus value and the simulated best focus value, and then add or subtract that value to the simulated best focus. Determining whether to add or subtract is accomplished in the same way as the RSS method. In either embodiment of this invention, the simulated defocus values can be replaced directly with the FBC simulated defocus values.

Figure 12:
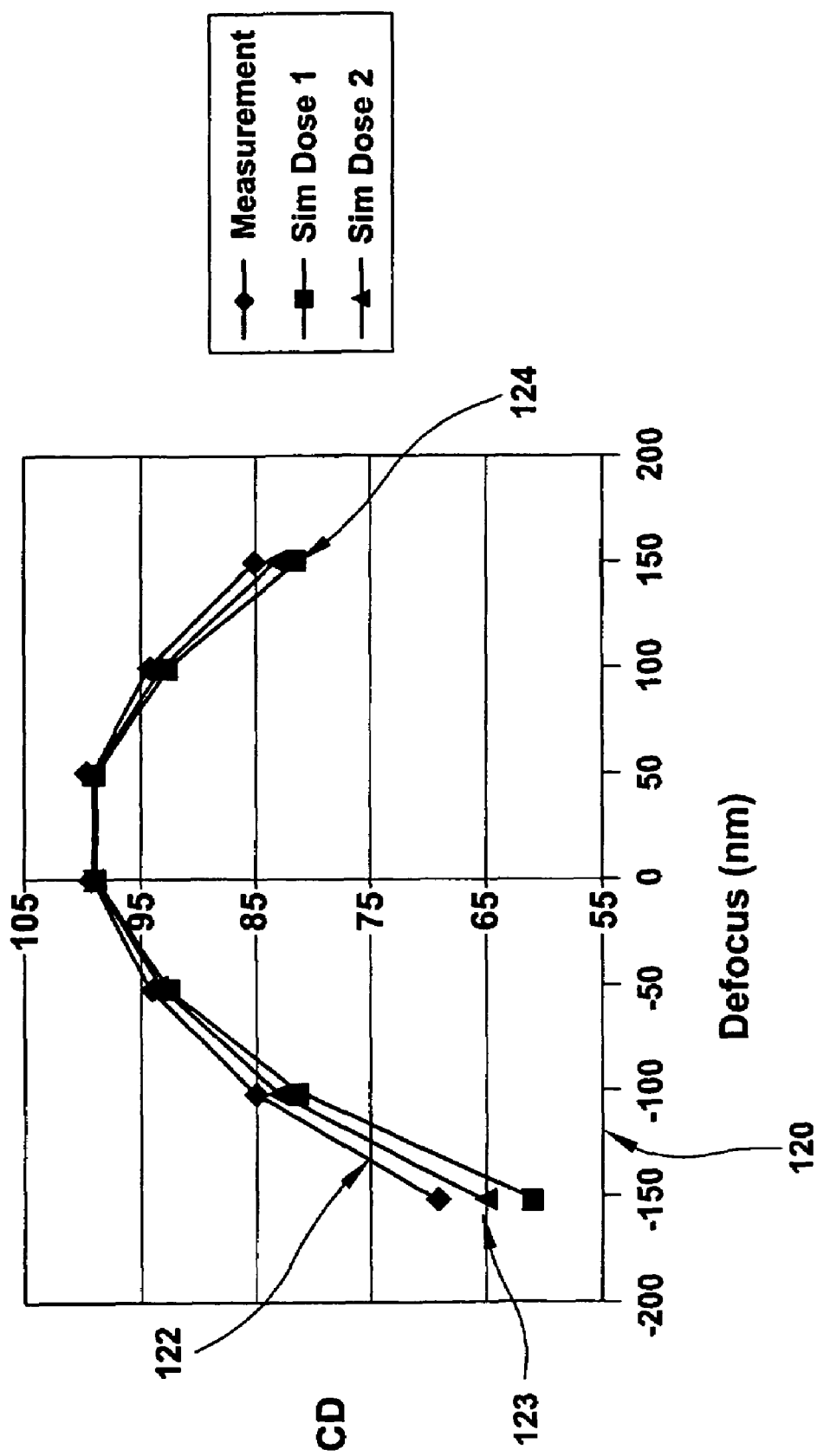
FIG. 12 depicts a graph of the reference threshold adjustment for the measurement values and the simulation values.

Once the image plane and defocus positions are fixed, the next step in minimizing the error between the simulated and empirical data is to fine-tune the relative dose between the two. Depending on the form of the photoresist model, this procedure may vary. In the present explanation, a VTR model is utilized, but other model forms could also be used with equivalent results. Here the reference threshold is considered analogous to the exposure dose and this threshold value is adjusted to flatten the through-focus error curve. For example, as depicted by FIG. 6, the error values for the error curve are all positive. The defocus is aligned between the simulation data and the empirically derived data. However, the shape of the curve does not match. The reference threshold may be used to match the curves. FIG. 12 depicts a graph 120 of the reference threshold adjustment for the measurement values 122 and the simulation values 123 and 124. In the FIG. 12 example, the simulation 124 is predicting a smaller result than the measured data 122. Consequently, the reference threshold is increased with the resulting simulation 123 better matching the measurement values 122. If the error curve had been positive, the reference threshold would have been decreased. It is understood that the simulated response to a dose adjustment is process dependent and that some process conditions will exhibit the opposite effect.

With the optimum overlay of the empirical and simulated focus and dose conditions achieved, the photoresist model may now be calibrated. This calibration may occur through industry standard curve-fitting procedures, using nominal empirical data or by curve fitting to all of the through-focus data. Since the optical parameters of focus and dose have been properly accounted for in the optical model, their effects will not be coupled into the photoresist model. The resulting photoresist model will, therefore, describe only the behavior of the photoresist and will allow more accurate process window simulations.

Figure 13:
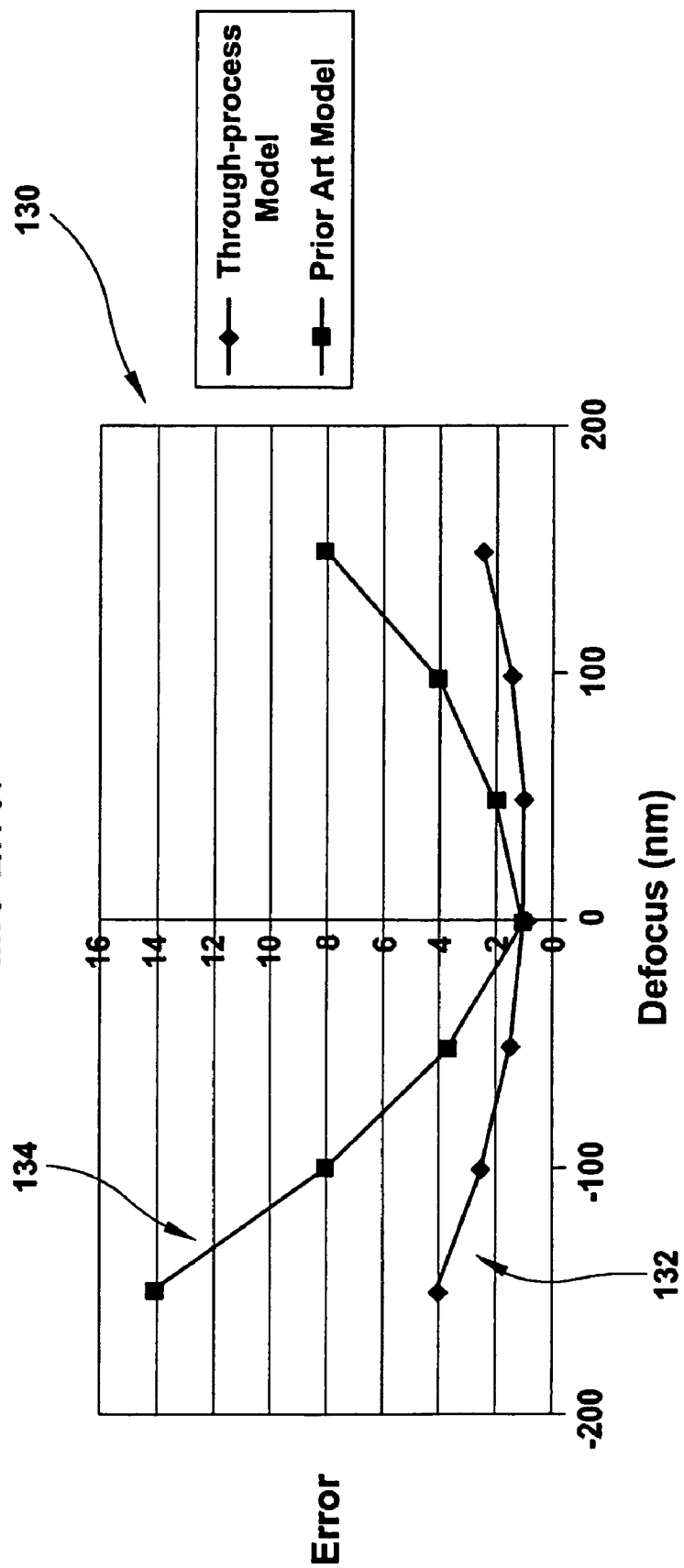
FIG. 13 is a graph depicting the comparison in model accuracy in RMS error between the through-focus model of the present invention and the traditional modeling technique using the same calibration data.

FIG. 13 is a graph 130 depicting the comparison in model accuracy between the through-focus model 132 of the present invention in RMS error and the traditional modeling technique 134 using the same calibration data. The through-focus model exhibits a more accurate and stable model at nominal and through-focus positions.

The preferred practice for building an OPC model by the present methodology includes: a) collecting empirical data, preferable SEM data; b) comparing empirical data to image data; c) selecting the optimal image plane by obtaining the simulated center focus and image plane for all calibration data by finding the point of minimum error when measured against the image plane, and the point of symmetry when measured against defocus; d) building a first photoresist model using nominal focus and dose data; e) adjusting the simulated defocus to align the simulated best focus with the experimental best focus; f) adjusting the dose to flatten the error through-focus curve; and f) building a second photoresist model using data from one or more focus positions, attributing any mismatch in curvature to the photoresist model errors.

An alternative practice for building an OPC model by the present methodology includes: a) collecting empirical data, preferable SEM data; b) obtaining the image plane and defocus position to align the simulated best focus with the experimental best focus by finding the point of minimum through-focus error when measured against the image plane, and the point of symmetry in through-focus error when measured against defocus; c) adjusting the dose to flatten the error through-focus curve; and d) building a first photoresist model using data from one or more focus positions.

The above-identified methods may be implemented within a program storage device, readable by a machine, tangibly embodying a program of instructions executable by the machine to perform the method steps of each preferred method embodiment. Additionally, the program storage device may perform the method steps for OPC model calibration, including: a) collecting empirical data, preferable SEM data; b) comparing empirical data to image data; c) selecting the optimal image plane by obtaining the simulated center focus and image plane for all calibration data by finding the point of minimum error when measured against the image plane, and the point of symmetry when measured against defocus; d) building a first photoresist model using nominal focus and dose data; e) adjusting the simulated defocus to align the simulated best focus with the experimental best focus; f) adjusting the dose to flatten the error through-focus curve; and g) building a second photoresist model using data from one or more focus positions, attributing any mismatch in curvature to the photoresist model errors.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for a lithographic process model calibration for separating optical and photoresist effects, said method comprising:

identifying a set of test patterns for model calibration and simulating a printed image, wherein said test patterns are printed onto a substrate using said lithographic process; and determining best alignment of simulated and empirical best focus positions through modeling of the difference between simulated and empirical critical dimension measurements of said test patterns for a plurality of focus positions including a plurality of optical image plane positions, including:

determining said simulated and empirical best focus positions, including optical image plane positions;

collecting empirical data at various focus points in the region of said best focus or at various exposure dose values, including collecting SEM measurements representing empirical data of said test patterns, wherein said SEM measurements are made on said test patterns exposed to nominal process conditions;

determining a symmetry point of difference using said plurality of focus positions at said image plane position;

determining optimal location of said optical image plane position by determining a minimum point of said difference using said plurality of image plane positions, wherein said optimal image plane position and said simulated best focus position form a saddle point of said difference using said plurality of focus and optical image plane positions;

determining offset of said simulated and empirical best focus positions;

adding a focus-blur correction to said offset to create a focus-blur-corrected offset; and calibrating a photoresist model based on minimizing said difference between empirical data for test patterns exposed at nominal focus and dose conditions and simulations of said test patterns, wherein a focus value used in said simulation corresponds to said offset or to said focus-blur-corrected offset, added to said exposed nominal focus value.

2. The method of claim 1 wherein said optimal image plane position and said simulated best focus position form a minimum point of said error using said plurality of focus and optical image plane positions.

3. The method of claim 1 further comprising aligning said simulated and empirical best focus positions in accordance with said offset between said simulated best focus and said empirical best focus position.

4. The method of claim 1 wherein said error is minimized by varying a simulated exposure dose.

5. The method of claim 1 including collecting empirical data at various focus points in the region of said best focus.

6. The method of claim 1 wherein said error is calculated based on a weighted average critical dimension or weighted average edge placement error of said test patterns.

7. The method of claim 1 including collecting SEM measurements representing empirical data of said test patterns.

8. The method of claim 1 further comprising simulating said test patterns using initial values of free optical parameters and an initial photoresist model.

9. The method of claim 1 including using said initial photoresist model with said optical model for predicting pattern transfer process and computing simulated critical dimensions or edge placement errors for said test patterns.

10. A method for a lithographic process model calibration for separating optical and photoresist effects, said method comprising:
identifying a set of test patterns for model calibration, wherein said test patterns are printed onto a substrate using said lithographic process, and have design data for simulation; and
determining best alignment of simulated and empirical best focus positions through modeling of error between simulated and empirical critical dimension measurements of said test patterns for a plurality of focus and optical image plane positions, said best alignment of simulated and empirical best focus including selecting a symmetry point on a plot of said error versus defocus values for selected image planes, said optical image plane including selecting a first minimum point on a plot of said error, wherein said error includes an RMS error, mean error, WACD error, or WAEPE error; and
said step of determining best alignment includes using errors computed with off-focus data, and comparing off-focus simulated data to off-focus empirical data, where said off-focus simulations are performed at off-focus simulated defocus-values;
said off-focus simulated defocus-values are equal to a sum of a nominal simulated defocus value plus a difference between corresponding off-focus empirical defocus values and nominal empirical defocus value, and said off-focus simulated defocus-values include an adjustment to account for focus-blurring mechanisms, wherein said off-focus simulated defocus-values are equal to
a) a sum of said nominal simulated defocus value plus a factor times a root-squared-sum of said focus-blur value and a defocus value, where said defocus value equals a difference between corresponding off-focus empirical defocus values and nominal empirical defocus value; said factor is set to 1 for said off-focus empirical defocus values greater than or equal to said empirical best focus position, and said factor is set to −1 for said off-focus empirical defocus values less than said empirical best focus position; or
b) a sum of said nominal simulated defocus value plus a factor times a sum of an absolute value of said focus-blur value and a defocus value, where said defocus value equals a difference between corresponding off-focus empirical defocus values and nominal empirical defocus value; said factor is set to 1 for said off-focus empirical defocus values greater than or equal to said empirical best focus position, and said factor is set to −1 for said off-focus empirical defocus values less than said empirical best focus position.

* * * * *

UNITED STATES PATENT AND TRADEMARK OFFICE
CERTIFICATE OF CORRECTION

PATENT NO. : 7,642,020 B2  Page 1 of 1
APPLICATION NO. : 11/465227
DATED : January 5, 2010
INVENTOR(S) : Han et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 334 days.

Signed and Sealed this

Sixteenth Day of November, 2010

David J. Kappos
*Director of the United States Patent and Trademark Office*